(12) United States Patent
Sanchot et al.

(10) Patent No.: US 10,232,404 B2
(45) Date of Patent: Mar. 19, 2019

(54) METHOD OF MANUFACTURING A LAYER CONTAINING QUANTUM DOTS

(71) Applicant: Commissariat à l'Énergie Atomique et aux Énergies Alternatives, Paris (FR)

(72) Inventors: Audrey Sanchot, Grenoble (FR); Bernard Aventurier, Saint Joseph de Riviere (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 32 days.

(21) Appl. No.: 15/350,174

(22) Filed: Nov. 14, 2016

(65) Prior Publication Data

US 2017/0136490 A1 May 18, 2017

(30) Foreign Application Priority Data

Nov. 17, 2015 (FR) ...................... 15 61047

(51) Int. Cl.
*H01L 33/50* (2010.01)
*B05D 1/00* (2006.01)
(Continued)

(52) U.S. Cl.
CPC .............. *B05D 1/005* (2013.01); *B05D 3/06* (2013.01); *B05D 3/107* (2013.01); *B05D 3/145* (2013.01);
(Continued)

(58) Field of Classification Search
CPC ....... G03F 7/0007; G02B 5/201; G02B 5/223; F21V 9/08; H01L 33/502; H01L 33/504;
(Continued)

(56) References Cited

U.S. PATENT DOCUMENTS

| 2010/0059771 A1 | 3/2010 | Lowery et al. |
| 2013/0011635 A1 | 1/2013 | Park et al. |

(Continued)

FOREIGN PATENT DOCUMENTS

| JP | 2003298120 A | 10/2003 |
| WO | WO 2004/074173 A1 | 9/2004 |
| WO | WO 2015/135839 A1 | 9/2015 |

OTHER PUBLICATIONS

French Search Report, dated Jul. 12, 2015, from related French Patent Application No. 15/61047.

(Continued)

*Primary Examiner* — John A McPherson
(74) *Attorney, Agent, or Firm* — Wolf, Greenfield & Sacks, P.C.

(57) ABSTRACT

A method of manufacturing a layer containing quantum dots, the layer including first regions where the quantum dots are active and second regions where the quantum dots are inactive, the method including: a) depositing on a support a first layer of a matrix containing quantum dots; b) depositing on the first layer a second resist layer; c) exposing the second layer to light through a mask delimiting the first and second regions, and then developing the resin of the second layer to remove the resin of the second layer opposite the second regions while keeping it opposite the first regions; and d) removing the resin of the second layer opposite the first regions without removing the first layer.

13 Claims, 1 Drawing Sheet

(51) Int. Cl.
*G03F 7/00* (2006.01)
*B05D 3/06* (2006.01)
*B05D 3/10* (2006.01)
*B05D 3/14* (2006.01)
*F21V 9/08* (2018.01)
*F21Y 115/10* (2016.01)

(52) U.S. Cl.
CPC .............. *F21V 9/08* (2013.01); *G03F 7/0007* (2013.01); *H01L 33/502* (2013.01); *H01L 33/505* (2013.01); *H01L 33/508* (2013.01); *F21Y 2115/10* (2016.08); *H01L 33/504* (2013.01); *H01L 2933/0041* (2013.01)

(58) Field of Classification Search
CPC ................. H01L 33/505; H01L 33/508; H01L 3922/0041; B82Y 20/00
USPC ............................................................ 430/7
See application file for complete search history.

(56) References Cited

U.S. PATENT DOCUMENTS

| | | |
|---|---|---|
| 2014/0014988 A1 | 1/2014 | Schubert |
| 2017/0254934 A1* | 9/2017 | Liang ..................... G02B 5/201 |
| 2017/0256591 A1* | 9/2017 | Li ..................... G02F 1/133514 |

OTHER PUBLICATIONS

Tagliazucchi et al.: "High-Contrast Photopatterning of Photoluminescence within Quantum Dot Films through Degradation of a Charge-Transfer Quencher," (2012) Adv. Mater.; pp. 3617-3621.

Jasieniak et al.: "Re-examination of the Size-Dependent Absorption Properties of CdSe Quantum Dots," (2009) J. Phys. Chem; pp. 19468-19474.

Hu et al.: "The micropatterning of layers of colloidal quantum dots with inorganic ligands using selective wet etching," (2014) Nanotechnology; 11 pp.

European Office Action for Application No. 16 197 403.5 dated Aug. 30, 2017.

* cited by examiner

METHOD OF MANUFACTURING A LAYER CONTAINING QUANTUM DOTS

CROSS-REFERENCE TO RELATED APPLICATION

This application claims priority to French patent application number 15/61047, filed Nov. 17, 2015, which is hereby incorporated by reference in its entirety to the maximum extent allowable by law.

BACKGROUND

The present disclosure relates to a method of manufacturing a layer containing quantum dots, the layer comprising first regions where the quantum dots are active, and second regions where the quantum dots are inactive.

DISCUSSION OF THE RELATED ART

Term quantum dot designates a three-dimensional semiconductor nanoparticle of crystalline structure, having quantum confinement properties in the three dimensions of space. Quantum dots have physical properties, particularly magnetic properties, electric properties, and optical properties, which vary according to their dimensions and according to the materials forming them. The dimensions of a quantum dot are typically in the range from 1 to 100 nm.

Quantum dots in particular have the property of being photoluminescent, that is, when they are illuminated by a light source, they absorb photons originating from the light source, and then reemit light as a response to this photoexcitation. While the absorption wavelength band, that is, the illumination wavelength band in which a quantum dot absorbs photons, may be relatively wide, the emission wavelength band, that is, the wavelength band in which the quantum dot reemits light, is generally very narrow, for example, with a full width at half maximum smaller than 50 nm. Further, the central wavelength of the emission band may be finely adjusted by varying, in particular, the dimensions of the quantum dot.

One of the applications of quantum dots in optics is color conversion. It has in particular been provided to form a luminous display screen comprising a plurality of light-emitting diodes capable of emitting light of a first color, for example, blue light, the diode assembly being coated with a layer comprising quantum dots to convert into one or a plurality of other colors, for example, into red light in certain regions of the screen and into green light in other regions of the screen, the light emitted by the light-emitting diodes.

The forming of such a screen however raises practical difficulties, particularly due to the properties that the quantum dot layer should have, and in particular its thickness and its quantum dot concentration, to be able to absorb all or almost all the light emitted by the light-emitting diodes in the screen areas where the light is desired to be converted. Another difficulty is that it should be possible to define the different emission regions of the quantum dot layer with a resolution adapted to the size of the pixels or emitting areas of the screen.

SUMMARY

Thus, an embodiment provides a method of manufacturing a layer containing quantum dots, the layer comprising first regions where the quantum dots are active, and second regions where the quantum dots are inactive, the method comprising the steps of: a) depositing on a support a first layer of a matrix having quantum dots incorporated into it; b) depositing on the first layer a second resist layer; c) exposing the second layer to light through a mask delimiting, in top view, the first and second regions, and then developing the resin of the second layer opposite the second regions in order to remove the resin of the second layer opposite the second regions, and to keep the resin of the second layer opposite the first regions; and d) removing the resin of the second layer opposite the first regions without removing the matrix of the first layer opposite the first regions.

According to an embodiment, the matrix of the first layer is a resist.

According to an embodiment, the resist of the first layer is selected from one of the families of the assembly comprising the family of positive resists and the family of negative resists, and wherein the resist of the second layer is selected from the other family of said assembly.

According to an embodiment, the matrix of the first layer is a negative resist and the resin of the second layer is a positive resist.

According to an embodiment, the matrix of the first layer is a SU8-type resist and the resin of the second layer is a TELR-type resin.

According to an embodiment, the method comprises no step of exposing the matrix of the first layer to light before depositing the second layer.

According to an embodiment, the step of developing the resin of the second layer comprises dipping the second layer into a TMAH-based solution.

According to an embodiment, the quantum dots incorporated in the matrix of the first layer are quantum dots of CdSe/ZnS type.

According to an embodiment, at step d), the resin of the second layer is removed by oxygen plasma etching.

According to an embodiment, the method further comprises, after step d), a step of etching an upper surface portion of the first layer According to an embodiment, the step of etching an upper surface portion of the first layer is carried out by oxygen and sulfur hexafluoride plasma etching.

According to an embodiment, steps a), b), c), and d) are repeated a second time to form, on the first layer, a third layer containing quantum dots, the third layer comprising first regions where the quantum dots are active, and second regions where the quantum dots are inactive.

According to an embodiment, the first regions of the third layer are arranged opposite second regions of the first layer, and second regions of the third layer are arranged opposite first regions of the first layer.

Another embodiment provides a device comprising a light source and, opposite the light source, a layer containing quantum dots formed by a method of the above-mentioned type.

Another embodiment provides a device comprising a light source and, opposite the light source, a stack of a first layer containing quantum dots and of a second layer containing quantum dots, formed by a method of the above-mentioned type.

The foregoing and other features and advantages will be discussed in detail in the following non-limiting description of specific embodiments in connection with the accompanying drawings.

DETAILED DESCRIPTION

Figure 1A:
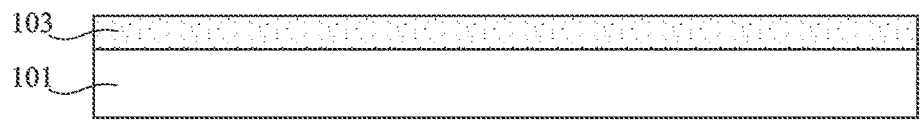
FIGS. 1A, 1B, 1C, and 1D are cross-section views schematically illustrating steps of an embodiment of a method of manufacturing a layer containing quantum dots, the layer comprising first regions where the quantum dots are active, and second regions where the quantum dots are inactive.

The same elements have been designated with the same reference numerals in the different drawings and, further, the various drawings are not to scale. In the following description, when reference is made to terms qualifying the position and orientation such as "above", "under", "upper", "lower", etc., reference is made to the representation of the drawings, it being understood that, in practice, the described structures may be oriented differently. Unless otherwise specified, expressions "substantially", "almost", "approximately", and "in the order of" mean to within 10%, preferably to within 5%.

FIG. 1A illustrates a step of depositing, on the upper surface of a support substrate 101, for example, a silicon substrate, a layer 103 comprising a matrix of transparent resist where quantum dots are incorporated. In this example, the resist of layer 103 belongs to the family of negative resists, that is, resins for which the portions exposed to a light radiation during a resin insolation step become non-soluble in a developer applied to the resin in a subsequent development step, and for which the portions which have not been exposed to light radiation are soluble in the developer. The resist of layer 103 is for example a resin based on polyepoxides, for example, a resin selected from the family of negative SU8-type resins, that is, having its elementary molecule comprising eight polyepoxide groups. As an example, the resist of layer 103 is a resin of the type designated by trade name SU8 1020PI by GERSELTEC ENGINEERING SOLUTIONS.

Quantum dots mixed with the resin of layer 103 are for example quantum dots based on cadmium selenide (CdSe), for example, quantum dots having a CdSe/ZnS-type core-shell structure. As a variation, the quantum dots of layer 103 are quantum dots having a core-shell structure, of InP/ZnS or CdS/ZnS or CdSe/ZnSe or PbS/CdS type.

As an example, the incorporation of the quantum dots in the resist may comprise a step of mixing the quantum dots initially in the form of powder in a solvent, for example, chloroform. The solution thus obtained may then be mixed with resin. As an example, the quantum dots may be mixed in the solvent at a concentration in the range from 1 to 100 mg/ml, after which the obtained solution may be mixed with the resin, for example, according to a ratio in the order of 2 for 1 by volume (2 volumes of solution for 1 volume of resin).

Prior to the deposition of layer 103, the upper surface of support substrate 101 may be prepared, for example, by means of an oxygen plasma, to improve the adherence and/or the uniformity of layer 103.

Resin layer 103 may be spread on the upper surface of substrate 101, for example, by spin coating. An anneal of the structure, for example, at a temperature in the range from 80 to 150° C. for a time period in the range from 30 to 120 seconds, may then be carried out to harden resin layer 103 to reinforce its mechanical resistance.

As an example, the thickness of layer 103 is in the range from 0.5 to 50 µm, for example, in the order of 0.9 µm. As an illustration, the calculations performed by the inventors have shown that a thickness in the order of 1 µm enables to absorb 99% of the blue light emitted by a gallium nitride light-emitting diode for a volume filling rate of layer 103 in the order of 50%.

Figure 1B:
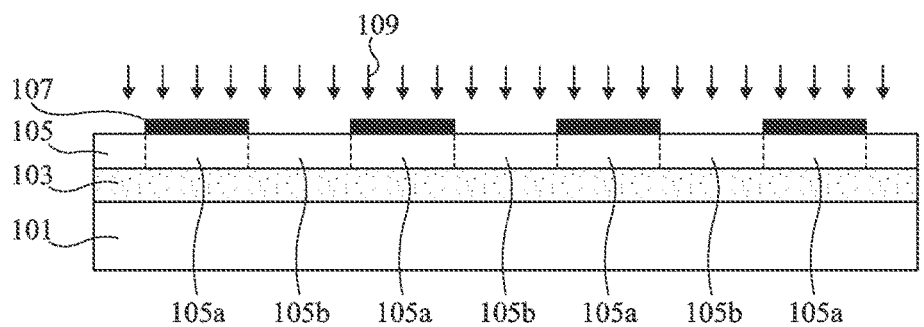

FIG. 1B illustrates a step of depositing, on the upper surface of layer 103, a resist layer 105. In this example, the resist of layer 105 belongs to the family of positive resists, that is, resins for which the portions exposed to a light radiation during a resin insolation step become soluble in a developer applied to the resin in a subsequent development step, and for which the portions which have not been exposed to the light radiation are non-soluble in the developer. As an example, the resist of layer 105 is a resin of the type designated by trade name TELR by TOK EUROPE. Unlike layer 103, resin layer 105 contains no quantum dots. It should further be noted that no step of exposure of layer 103 to light, that is, of exposure of layer 103 to a light radiation likely to modify its structure, between the step of forming layer 103 and the step of depositing layer 105, is not provided.

Resin layer 105 may be spread on the upper surface of substrate 101, for example, by spin coating. An anneal of the structure, for example, at a temperature in the range from 80 to 150° C. for a time period in the range from 30 to 120 seconds, may then be carried out to harden resin layer 105 to reinforce its mechanical resistance.

FIG. 1B further illustrates a step subsequent to the deposition of resin layer 105, during which layer 105 is exposed to light through a mask 107 arranged above its upper surface. Mask 107 covers first regions 105a of layer 105 and comprises openings opposite second regions 105b of layer 105. During the insolation step, the upper surface of the assembly is exposed to a light radiation 109 capable of modifying the chemical structure of the resin of layer 105 in the regions of layer 105 exposed to this radiation. The radiation applied to expose the resin of layer 105 to light is for example a violet or ultraviolet radiation, for example, a radiation having a wavelength in the range from 350 to 450 nm.

After the insolation step, mask 107 is removed, and an anneal for stabilizing the structure, for example, at a temperature in the range from 80 to 150° C. for a time period in the range from 30 to 120 seconds, may be carried out.

Figure 1C:
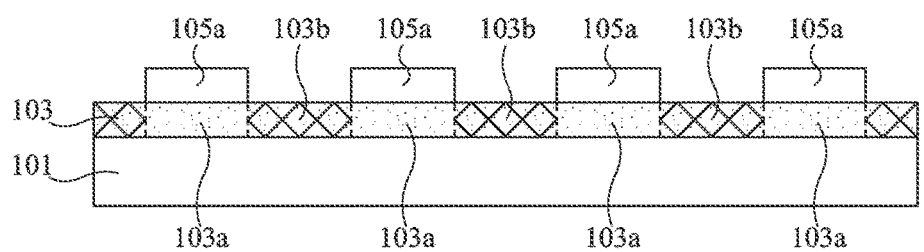

FIG. 1C illustrates a step of developing resin layer 105, subsequent to the insolation step described in relation with FIG. 1B. During this step, the assembly formed by substrate 101 and by layers 103 and 105 is dipped into a development bath capable of developing in resin layer 105 the pattern exposed through mask 107 during the insolation step. The development bath for example comprises a solution based on tetramethylammonium hydroxide (TMAH), for example, a solution designated with trade name TMAH238 by MICROCHEMICALS. During this step, the regions 105b of resin layer 105 which have been previously exposed during the insolation step are removed by dissolution in the developer. Thus, at the end of the development step, there only remain of layer 105 the regions 105a masked during the insolation step.

As an example, during the development step, the structure is dipped into the development bath for from 30 to 120 seconds to obtain clear patterns in layer 105, and then rinsed with water and dried.

Surprisingly, the inventors have observed that at the end of the development step of FIG. 1C, the quantum dots contained in regions 103b of layer 103 above which the resin of layer 105 is fully removed during the development step are inactive, while the quantum dots contained in regions 103a of layer 103 above which the resin of layer 105 is not removed during the development step have remained active. "Inactive" here means that the quantum dots contained in regions 103b of layer 103 have lost their photoluminescent properties, and that regions 103b of layer 103 are now substantially transparent for visible light, that is, they transmit with no significant modifications, particularly of color, the light that they receive. Further, "active" here means that the quantum dots contained in regions 103a of layer 103 have kept their initial photoluminescent properties.

Figure 1D:
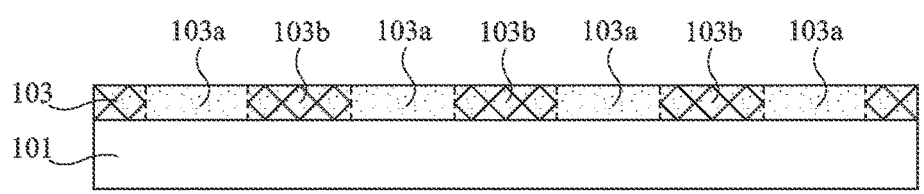

FIG. 1D illustrates a step subsequent to the development step of FIG. 1C, during which the remaining regions 105a of resin layer 105 are removed, without having previously removed and without simultaneously removing regions 103b of layer 103. In other words, the removal of remaining regions 105a of resin layer 105 is selective over the resin of layer 103. As an example, the removal of regions 105a of resin layer 105 is removed by dry etching by means of an oxygen plasma.

The measurements performed show that after the removal of regions 105a of layer 105, the quantum dots contained in regions 103a of layer 103 are still active, and the quantum dots contained in regions 103b of layer 103 are still inactive.

Thus, the provided method provides a layer 103 of substantially constant thickness containing quantum dots, the layer comprising first regions 103a where the quantum dots are active, and second regions 103b where the quantum dots are inactive.

After the step of removing regions 105a of layer 105, an additional step of physical etching of an upper surface portion of layer 103, for example, by means of an oxygen and sulfur hexafluoride plasma ($SF_6$), may be implemented. This additional etch step enables to enhance the contrast of the photoluminescent pattern defined in layer 103.

In a subsequent step, layer 103 where the photoluminescent pattern is formed may for example be placed opposite an illumination device, for example, an array of light-emitting diodes, after which support substrate 101 may be removed. As a variation, support substrate 101 may be made of a transparent material, for example, glass, in which case the assembly comprising support substrate 101 and layer 103 may be arranged opposite the illumination device. As a variation, support substrate 101 may directly be a semiconductor substrate where light-emitting diodes have been previously formed, layer 103 being then directly formed above the light-emitting diodes.

An advantage of the provided method especially is that the obtained color conversion layer 103 has a constant or almost constant thickness, which gives it a relatively high robustness, and makes the assembly with a possible additional optical element easier.

Another advantage of the provided method is that the layer of quantum dots 103, due to its morphology and to its stability, is compatible with placing, bonding, and alignment techniques standard in microelectronics.

Another advantage of the provided method is due to the fact that the incorporation of quantum dots in a resin layer provides a relatively thick layer 103, which is particularly adapted for color conversion applications in luminous display screens.

Another advantage of the provided method is that the photoluminescent patterns may be defined in layer 103 with a relatively high resolution. As an illustration, the provided method enables to define in layer 103 photoluminescent pads having lateral dimensions in the range from 1 to 10 µm and a spacing in the range from 1 to 10 µm, which is compatible with the forming of a luminous display screen based on light-emitting diodes.

Figure 2:
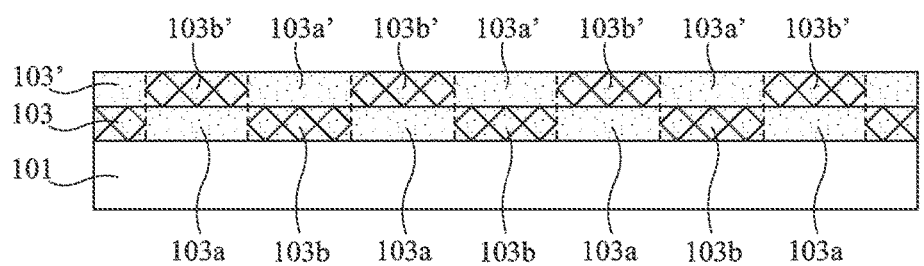
FIG. 2 is a cross-section view schematically illustrating an alternative embodiment of the method described in relation with FIGS. 1A to 1D.

FIG. 2 is a cross-section view schematically illustrating an alternative embodiment of the method described in relation with FIGS. 1A to 1D.

In the example of FIG. 2, the method described in relation with FIGS. 1A to 1D is repeated a second time to form, on the upper surface of layer 103, a resin layer 103' where quantum dots are incorporated, this layer comprising regions 103a' where the quantum dots are active, and regions 103b' where the quantum dots are inactive.

As an example, the active quantum dots of layer 103 are capable of converting the light of a luminous excitation source into light of a first color, for example, into red light, and the active quantum dots of layer 103' are capable of converting the light of the luminous excitation source into light of a second color different from the first color, for example, into green light. The quantum dots of layer 103' are for example of same nature as the quantum dots of layer 103, but of different dimensions.

Active regions 103a' of layer 103' are for example arranged opposite inactive regions 103b of layer 103. Although this is not shown in FIG. 2, inactive regions 103b' of layer 103' may be arranged opposite inactive regions 103b of layer 103, to transmit with no significant modification the light emitted by the luminous source.

Specific embodiments have been described. Various alterations, modifications, and improvements will occur to those skilled in the art. In particular, the described embodiments are not limited to the above-mentioned specific examples of dimensions and materials.

Further, although an example of a method where the matrix of layer 103 is a negative resist and the resin of layer 105 is a positive resist has been described hereabove, the two types of resin may be inverted, that is, the matrix of layer 103 may be selected from the family of positive resists, the resin of layer 105 then being selected from the family of negative resists.

More generally, the matrix of layer 103 may be made of a material other than a resist, for example, a non-photosensitive resin, silicone, or any other adapted polymer material.

Further, the described embodiments are not limited to the above-mentioned specific example of application to color conversion in a luminous display device. More generally, the provided method enabling to delimit active areas and inactive areas in a layer of a matrix incorporating quantum dots may be used in other fields.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a layer containing quantum dots, the layer comprising first regions where the quantum dots are active, and second regions where the quantum dots are inactive, the method comprising the steps of:
   a) depositing on a support a first layer of a matrix having quantum dots incorporated into it;
   b) depositing on the first layer a second resist layer;
   c) exposing the second resist layer to light through a mask delimiting, in top view, the first and second regions, and then developing the second resist layer in order to remove the second resist layer opposite the second regions, and to keep the second resist layer opposite the first regions; and d) removing the second resist layer opposite the first regions without removing the matrix of the first layer opposite the first regions, wherein the matrix of the first layer is a resist selected from one of the families of the assembly comprising the family of positive resists and the family of negative resists, and wherein the second resist layer is made of a resist selected from the other family of said assembly.

2. The method of claim 1, wherein the matrix of the first layer is a negative resist and wherein the second resist layer is made of a positive resist.

3. The method of claim 1, comprising no step of exposure to light of the matrix of the first layer before the deposition of the second resist layer.

4. The method of claim 1, wherein the step of developing the second resist layer comprises dipping the second resist layer into a TMAH-based solution.

5. The method of claim 1, wherein the quantum dots incorporated in the matrix of the first layer are quantum dots of CdSe/ZnS.

6. The method of claim 1, wherein, at step d), the second resist layer is removed by oxygen plasma etching.

7. The method of claim 1, further comprising, after step d), a step of etching an upper surface portion of the first layer.

8. The method of claim 6, wherein said step of etching an upper surface portion of the first layer is carried out by oxygen and sulfur hexafluoride plasma etching.

9. The method of claim 1, wherein steps a), b), c), and d) are repeated a second time to form, on the first layer, a third layer containing quantum dots, the third layer comprising first regions where the quantum dots are active, and second regions where the quantum dots are inactive.

10. The method of claim 9, wherein the first regions of the third layer are arranged opposite second regions of the first layer, and wherein second regions of the third layer are arranged opposite first regions of the first layer.

11. A device comprising a light source and, opposite the light source, a stack of a first layer containing quantum dots and of a second layer containing quantum dots, formed by the method of claim 9.

12. A device comprising a light source and, opposite the light source, a layer containing quantum dots formed by the method of claim 1.

13. The method of claim 1, wherein the matrix of the first layer is a positive resist and wherein the second resist layer is made of a negative resist.

* * * * *